United States Patent
McLeod et al.

(10) Patent No.: US 6,733,590 B1
(45) Date of Patent: *May 11, 2004

(54) METHOD AND APPARATUS FOR MULTILAYER DEPOSITION UTILIZING A COMMON BEAM SOURCE

(75) Inventors: Paul Stephen McLeod, Berkeley, CA (US); Mark A. Shows, San Jose, CA (US)

(73) Assignee: Seagate Technology LLC., Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/526,556

(22) Filed: Mar. 16, 2000

Related U.S. Application Data

(60) Provisional application No. 60/132,213, filed on May 3, 1999.

(51) Int. Cl.[7] .................. C23C 16/00; C23F 1/00
(52) U.S. Cl. ............ 118/715; 118/723 FI; 156/345.29; 156/345.33
(58) Field of Search ............ 118/723 FI, 723 FE, 118/715; 156/345, 345.29, 345.33, 345.39, 345.4

(56) References Cited

U.S. PATENT DOCUMENTS

| | | | |
|---|---|---|---|
| 4,717,596 A | * | 1/1988 | Barbee et al. ............ 427/248.1 |
| 4,793,908 A | | 12/1988 | Scott et al. |
| 4,862,032 A | | 8/1989 | Kaufman et al. |
| 5,091,207 A | * | 2/1992 | Tanaka ....................... 427/8 |
| 5,190,913 A | * | 3/1993 | Higashiyama et al. ....... 505/1 |
| 5,192,523 A | | 3/1993 | Wu et al. |
| 5,250,323 A | * | 10/1993 | Miyazaki ................ 427/255.1 |
| 5,455,081 A | | 10/1995 | Okada et al. |
| 5,458,689 A | * | 10/1995 | Saito ........................ 118/724 |
| 5,482,602 A | | 1/1996 | Cooper et al. |
| 5,508,368 A | | 4/1996 | Knapp et al. |
| 5,554,226 A | * | 9/1996 | Okase et al. ............... 118/724 |
| 5,607,783 A | | 3/1997 | Onodera |
| 5,714,044 A | | 2/1998 | Lal et al. |
| 5,785,825 A | | 7/1998 | Hwang et al. |
| 5,855,746 A | | 1/1999 | Prabhakara et al. |
| 5,888,593 A | | 3/1999 | Petrmichl et al. |
| 5,942,317 A | | 8/1999 | White |
| 6,077,718 A | * | 6/2000 | Takasu et al. ............... 438/16 |

* cited by examiner

*Primary Examiner*—Luz Alejandro-Mulero
(74) *Attorney, Agent, or Firm*—McDermott, Will & Emery

(57) ABSTRACT

A single, or common, ion beam source is utilized for ion beam deposition (IBD) of defect-free multilayer coatings, e.g., multilayer, carbon-based protective overcoats for magnetic and/or magneto-optical (MO) data recording/information storage and retrieval media such as hard disks. According to the inventive methodology, a plurality of source gas supply means for supplying a single IBD source with different source gases for each of the layers of the multilayer are selectively operated in "vent" and "run" modes by means of a plurality of valves, the opening and closing of which are determined by a programmable gas flow controller. The inventive method and apparatus advantageously provide IBD of multilayer coatings with minimum cross-contamination of individual layers, at a reduced equipment cost and size obtained by elimination of the need for separate ion beam sources and associated vacuum pump means for each constituent layer of the multilayer.

8 Claims, 2 Drawing Sheets

METHOD AND APPARATUS FOR MULTILAYER DEPOSITION UTILIZING A COMMON BEAM SOURCE

CROSS REFERENCE TO PROVISIONAL APPLICATION

This application claims priority from provisional patent application Ser. No. 60/132,213, filed May 3, 1999, the entire disclosure of which is incorporated herein by reference.

FIELD OF THE INVENTION

The present invention relates to a method and apparatus for multilayer ion beam deposition (IBD) utilizing a common ion beam source for depositing each constituent layer of the multilayer. The inventive method and apparatus enjoy particular utility in the manufacture of magnetic and/or magneto-optical (MO) data recording/information storage and retrieval media, e.g., hard disks, wherein, as part of the manufacturing methodology, multilayer protective overcoats are deposited over the recording media layer(s) for providing abrasion resistance and protection from environmentally-induced degradation, e.g., corrosion.

BACKGROUND OF THE INVENTION

A magnetic recording medium, e.g., a hard disk, typically comprises a laminate of several layers, including a non-magnetic substrate, such as of aluminum-magnesium (Al-Mg) alloy or a glass, ceramic, or glass-ceramic composite material and formed sequentially on each side thereof: a polycrystalline underlayer, typically of chromium (Cr) or, Cr-based alloy, a polycrystalline magnetic recording medium layer, e.g., of a cobalt (Co)-based alloy, a hard abrasion-resistant, protective overcoat layer, typically carbon (C)-based, and a lubricant topcoat layer. Magneto-optical (MO) media, e.g., in disk form, similarly comprise a laminate of several layers, including reflective, dielectric, thermo-magnetic, protective overcoat, and lubricant topcoat layers.

In operation of e.g., the magnetic recording medium, the polycrystalline magnetic recording medium layer is locally magnetized by a write transducer, or write head, to record and store information. The write transducer creates a highly concentrated magnetic field which alternates direction based upon the bits of information being stored. When the local magnetic field produced by the write transducer is greater than the coercivity of the recording medium, then the grains of the polycrystalline recording medium at that location are magnetized. The grains retain their magnetization after the magnetic field produced by the write transducer is removed. The direction of magnetization matches the direction of the applied magnetic field. The magnetization of the polycrystalline recording medium can subsequently produce an electrical response in a read transducer, allowing the stored information to be read.

Thin film magnetic and MO recording media are conventionally employed in disk form for use with disk drives for storing large amounts of data in magnetizable form. Typically, one or more disks are rotated on a central axis in combination with data transducer heads. In operation, a typical contact start/stop (CSS) method commences when the head begins to slide against the surface of the disk as the disk begins to rotate. Upon reaching a predetermined high rotational speed, the head floats in air at a predetermined distance above the surface of the disk due to dynamic pressure effects caused by air flow generated between the sliding surface of the head and the disk. During reading and recording operations, the transducer head is maintained at a controlled distance from the recording surface, supported on a bearing of air as the disk rotates, such that the head can be freely moved in both the circumferential and radial directions, thereby allowing data to be recorded on and retrieved from the disk at a desired position. Upon terminating operation of the disk drive, the rotational speed of the disk decreases and the head again begins to slide against the surface of the disk and eventually stops in contact with and pressing against the disk. Thus, the transducer head contacts the recording surface whenever the disk is stationary, accelerated from the static position, and during deceleration just prior to completely stopping. Each time the head and disk assembly is driven, the sliding surface of the head repeats the cyclic sequence consisting of stopping, sliding against the surface of the disk, floating in the air, sliding against the surface of the disk, and stopping.

As a consequence of the above-described cyclic CSS-type operation, the surface of the disk or medium surface wears off due to the sliding contact if it has insufficient abrasion resistance or lubrication quality, resulting in breakage or damage if the medium wears off to a great extent, whereby operation of the disk drive for performing reading and reproducing operations becomes impossible. The protective overcoat layer is formed on the surface of the polycrystalline magnetic recording medium layer so as to protect the latter from friction and like effects due to the above-described sliding action of the magnetic head. Abrasion-resistant, carbon (C)-containing protective coatings have been utilized for this purpose, and are typically formed by sputtering of a carbon target in an argon (Ar) atmosphere. Such amorphous carbon (a-C)-containing protective overcoat layers formed by sputtering have relatively strong graphite-type bonding, and therefore exhibit a low coefficient of friction in atmospheres containing water ($H_2O$) vapor, which characteristic is peculiar to graphite. However, the a-C layers produced in such manner have very low hardness as compared with many ceramic materials such as are employed as slider materials of thin film heads, and thus are likely to suffer from wear due to contact therewith.

In recent years, therefore, carbon-based protective overcoat layers having diamond-like hardness properties (i.e., HV of about 1,000–5,000 $g/mm^2$) have been developed, and films of diamond-like carbon (DLC) having a high percentage of diamond-type C—C bonding have been utilized. Such DLC films exhibit a high degree of hardness due to their diamond-like $sp^3$ bonding structure, and in addition, exhibit the excellent sliding properties characteristic of carbon, thus affording improved sliding resistance against sliders composed of high hardness materials. Such DLC films are generally obtained, by DC or RF magnetron sputtering of a carbon target in a gas atmosphere comprising a mixture of Ar gas and a hydrocarbon gas, e.g., methane ($CH_4$) or hydrogen ($H_2$) gas. The thus-obtained films exhibit DLC properties when a fixed amount of hydrogen is incorporated therein. Incorporation of excessive amounts of hydrogen in the films leads to gradual softening, and thus the hydrogen content of the films must be carefully regulated.

Amorphous, hydrogen-doped, i.e., hydrogenated carbon (a-C:H) films obtained by sputtering of carbon targets in an Ar+$H_2$ gas mixture and exhibiting diamond-like properties have also been developed for improving the tribological performance of disk drives; however, the electrical insulating properties of such type films lead to undesirable electrical charge build-up or accumulation over time during hard disk operation which can result in contamination, glide noise, etc. In order to solve this problem without sacrifice or diminution of the advantageous mechanical properties of such a-C:H films, attempts have been made to dope or otherwise incorporate nitrogen (N) atoms into the a-C:H films, in view of a substantial decrease in electrical resistivity and optical band gap ($E_{BG}$) exhibited by such N-doped a-C:H films relative to undoped films. In addition to these hydrogen-containing DLC materials, amorphous as well as crystalline DLC films and coatings comprising compounds of carbon and nitrogen ($CN_x$) have also been developed and evaluated for use as protective overcoat layers for magnetic recording media.

More recently, protective overcoats comprised of multiple layers of differently constituted carbon-based materials have been developed with the aim of providing magnetic recording media with optimal tribological (e.g., hardness) properties while at the same time providing one or more of good adhesion, low surface energy, reduced stiction, and superior corrosion protection. For example, U.S. Pat. Nos. 5,607,783 and 5,942,317 disclose formation of protective overcoats comprising multiple layers (e.g., 2–3) of C:H, each of the multiple layers having a different amount of hydrogen atoms incorporated therein. Typically, the content of hydrogen is highest in the uppermost layer and least in the lowermost layer. U.S. Pat. Nos. 5,714,044; 5,785,825; and 5,855,746 disclose formation of carbon-based multilayer protective overcoats wherein the lowermost layer in contact with the recording media layer surface comprises undoped carbon and the uppermost, exposed layer comprises carbon (C) doped with nitrogen (N) or hydrogen (H).

The above-mentioned undoped, amorphous carbon-based protective overcoat layers (a-C) are generally formed by sputtering of a carbon (C) target in an atmosphere comprising a rare gas, typically argon (Ar). Hydrogen-doped and nitrogen-doped amorphous carbon (a-C:H and a-C:N, respectively) films can be similarly produced by sputtering; however, the argon (Ar) gas is mixed with a certain amount of hydrogen ($H_2$) gas or nitrogen ($N_2$) gas. Although the doped amorphous carbon films are not as hard as undoped amorphous carbon films, they exhibit a significantly higher resistance to tribochemical wear than the undoped films. The overall performance of doped amorphous carbon films is thus superior to that of undoped amorphous carbon films, resulting in their currently being extensively employed in the manufacture of magnetic recording media.

However, a common problem encountered in the formation of doped amorphous carbon films utilized as protective overcoats for magnetic and/or MO recording media is arcing (i.e., sparking) from the carbon sputtering target which can damage or result in defects in the disk and its laminate of layers including the magnetic recording layer. Such damage is commonly termed carbon-induced damage (CID), which damage can adversely affect the information storage properties of the disk. Such arcing is believed to originate from the development of positive charge at local irregularities or foreign particles on the carbon target. Because the target is negatively biased during sputtering, a voltage is developed between the target and the local positive charge(sO on the carbon target. When the voltage becomes sufficiently high, a dielectric breakdown can occur which causes a large electric current density (i.e., arcing) in the local area. The arcing can, in turn, result in sputtering of glassy nodules present on the target surface, which sputtered glassy nodules can deposit on the disk surface and result in CID.

In addition to the above-described difficulty associated with sputtering of carbon targets, an additional factor providing impetus for the development of non-sputtering techniques for depositing carbon-based protective overcoats arises from the continuous increase in areal recording density of magnetic recording media which, in turn, requires a commensurately lower flying height of the transducer head. Therefore, it is considered advantageous to reduce the thickness of the carbon-based protective overcoat layer (or multilayer) without incurring adverse consequences. Conventional sputtered a-C:H and a-C:N materials are difficult to uniformly deposit in defect-free manner for the reason given above, and generally do not function satisfactorily in hard disk applications at reduced thicknesses. Therefore, the use of alternative deposition techniques for developing thinner and harder DLC layers having the requisite mechanical and tribological properties has been examined, such as, for example, chemical vapor deposition (CVD), ion beam deposition (IBD), and cathodic arc deposition (CAD) techniques. Of these, the IBD method has demonstrated ability to be utilized for forming undoped and doped ion beam-deposited carbon films that exhibit superior tribological performance at reduced thicknesses.

Conventional circularly-configured wide ion beam sources typically utilized for the deposition of IBD carbon-based films or coatings, such as Kauftnan, and gridless end-Hall and enclosed-drift end-Hall sources, are described in *Handbook of Ion Beam Processing Technology*, J. J. Cuomo et al., editors, Noyes Publications, Park Ridge, N.J., pp. 40–54, and in U.S. Pat. Nos. 4,862,032; 5,192,523; 5,482,602; and 5,508,368, the entire disclosures of which are incorporated herein by reference. Such type ion beam sources typically operate at pressures below about 1 mTorr in order to minimize the collision of energetic ions forming the ion beam with ambient energy molecules of the background gas, enable formation of an intense, highly ionized plasma, and thus permit carbon films to be obtained which exhibit optimum properties, e.g., hardness, for use as protective overcoat materials in hard disk applications. DLC materials in film or coating form can be produced on suitable hard disk substrates located in the path of the ion beam produced by such ion beam sources by introducing a hydrocarbon source gas (additionally with admixed nitrogen gas, if desired) into the ion beam exiting the orifice of the source or by passing the source gas(es) through the ion beam source from the rear thereof.

The ion beam source is typically integrated with sputtering equipment for continuous, automated manufacture of hard disks. More specifically, a typical automated hard disk manufacturing system includes at least one linearly elongated or circularly-shaped main vacuum chamber having a number of process stations serially arranged therein, each dedicated for deposition of a distinct material layer on the hard disk substrate or to another type of treatment, e.g., etching, cleaning, etc. When such systems are employed for the manufacture of magnetic or MO recording media, e.g., hard disks, each process station typically comprises a sub-chamber maintained under high vacuum conditions, e.g., for sequentially depositing on the hard disk substrate, as by cathode sputtering or other suitable technique, e.g., IBD, a respective one of the various layers comprising the recording medium. Workpiece (i.e., substrate) handling/transfer means are provided for transferring the substrates, in sequence, from a preceding station to a following station, with substantially distinct atmospheric conditions being maintained within each sub-chamber, depending upon the particular processing performed therein.

However, when depositing DLC layers for wear protection, whether by means of sputtering or IBD, it is often advantageous for the reasons given above, to deposit two or more differently constituted layers of carbon-based protective overcoat materials, each expressly grown to provide different film properties (e.g., hardness, wear resistance, adhesion, corrosion protection, stiction, etc.). Particularly in the case of IBD, it is often not possible for space reasons or practical for cost reasons to utilize more than one (e.g., 2–3) IBD sources in the automated hard disk manufacturing apparatus as described supra, inasmuch as the process chambers and associated vacuum pumps employed with IBD apparatus are quite large relative to typical sputter deposition sources, process chambers, and vacuum pumps.

Accordingly, there exists a need for an improved method and apparatus for forming multilayer films or coatings by IBD, particularly, but not limited to, multilayer carbon-based films suitable for use a protective overcoats for magnetic and/or magneto-optical (MO) recording/information storage and retrieval media which method and apparatus overcome the above-described drawbacks and disadvantages associated with conventional IBD technology, yet are simple, cost-effective, and fully compatible with the productivity and throughput requirements of automated disk manufacturing technology.

The present invention fully addresses and solves the above-described problems attendant upon the formation of multilayer films or coatings, e.g., protective overcoats suitable for use with high recording density magnetic and/or MO recording media, while maintaining full compatibility with all manufacturing and performance aspects of conventional disk drive technology.

DISCLOSURE OF THE INVENTION

An advantage of the present invention is an improved apparatus for ion beam deposition (IBD) of multilayer films or coatings utilizing a common ion beam source.

Another advantage of the present invention is an improved apparatus useful for IBD of multilayer protective overcoats for magnetic and/or magneto-optical (MO) data/information storage and retrieval media.

Yet another advantage of the present invention is an improved method for IBD of multilayer films or coatings utilizing a common ion beam source for deposition of each constituent layer of the multilayer stack.

Still another advantage of the present invention is an improved method for IBD of carbon-based multilayer protective overcoats for magnetic and/or MO data/information storage and retrieval media.

Additional advantages and other features of the present invention will be set forth in the description which follows and in part will become apparent to those having ordinary skill in the art upon examination of the following or may be learned from practice of the present invention. The advantages of the present invention may be realized and obtained as particularly pointed out in the appended claims.

According to one aspect of the present invention, the foregoing and other advantages are obtained in part by an apparatus for muiltilayer ion beam deposition, comprising:
(a) a process chamber having an interior space adapted to be maintained under vacuum conditions and including substrate mounting means within the chamber;
(b) an ion beam source means within the process chamber for deposition of at least one film on a surface of a substrate held by the substrate mounting means;
(c) a plurality of gas supply means for supplying the ion beam source means with source gases for film deposition, each of the plurality of gas supply means including means for providing a substantially constant flow of source gas therefrom;
(d) a vacuum pump means connected to each of the plurality of gas supply means; and
(e) a plurality of valve means, including a valve means connected to each of the plurality of gas supply means and to the vacuum pump means for selectively supplying source gas from one of the plurality of gas supply means while venting source gases from all others of the plurality of gas supply means to the vacuum pump means, for maintaining the substantially constant flow of source gas from each of the plurality of gas supply means.

According to embodiments of the present invention, each of the plurality of gas supply means supplies the ion beam source means with a different source gas for selective ion beam deposition of differently constituted films on the substrate surface.

According to further embodiments of the present invention, the apparatus additionally comprises:
(f) programmable gas flow controller means operatively connected to each valve means for providing the selective supplying of the ion beam source means with source gas from one of the plurality of gas supply means, wherein each of the valve means is pneumatically or electrically operable.

According to still further embodiments of the present invention, each of the plurality of valve means comprises a first valve means connected to a respective one of the plurality of gas supply means for supplying source gas therefrom to the ion beam source means and a second valve means connected to the one gas supply means for venting source gas therefrom to the vacuum pump means, wherein each of the first and second valve means may comprise normally closed valves and the second valve means is open when the first valve means is closed, and vice versa.

According to yet further embodiments of the present invention, each of the plurality of valve means comprises a valve means connected to a respective one of the plurality of gas supply means for alternately supplying source gas from the one of the plurality of gas supply means to the ion beam source means and venting source gas from the one of the plurality of gas supply means to the vacuum pump means, wherein each of the valve means may comprise a three-way valve.

According to still further embodiments of the present invention, the vacuum pump means is also connected to the process chamber for maintaining the vacuum conditions within the interior space thereof, and the ion beam source means comprises a broad beam ion source, e.g., an end-Hall type ion beam source or a Kaufmnan type ion beam source.

According to another aspect of the present invention, a method for multilayer ion beam deposition utilizing a common ion beam source for depositing each of the layers constituting the multilayer comprises the steps of:
(a) providing an ion beam deposition apparatus comprising:
i. a process chamber having an interior space maintained under vacuum conditions and including substrate mounting means therein;
ii. an ion beam source means within the process chamber for performing the multilayer deposition;
iii. a plurality of gas supply means for supplying the ion beam source means with source gases for the multilayer deposition, each of the plurality of gas supply means adapted for providing a constant flow of source gas therefrom;

iv. a vacuum pump means connected to each of the plurality of gas supply means; and
v. a plurality of valve means, including a valve means connected to each of the plurality of gas supply means and to the vacuum pump means for selectively supplying source gas from one of the plurality of gas supply means to the ion beam source means while venting source gas from all others of the plurality of gas supply means to the vacuum pump means;

(b) providing the substrate mounting means with a substrate having at least one deposition surface; and (c) ion beam depositing the multilayer film on the at least one substrate deposition surface, the ion beam depositing including the sequential steps of:
 i. establishing a substantially constant flow of source gas from each of the plurality of gas supply means to the vacuum pump means;
 ii. opening the valve means connected to a selected one of the plurality of gas supply means for supplying source gas therefrom to the ion beam source means and closing the valve means connecting the selected one of the plurality of gas supply means to the vacuum pump means, while maintaining closed the valve means connected to all others of the plurality of gas supply means for supplying source gas therefrom to the ion beam source means and maintaining open the valve means connecting all others of the plurality of gas supply means to the vacuum pump means;
 iii. ion beam depositing on the at least one substrate surface a layer of a selected material having a desired thickness, utilizing the source gas supplied to the ion beam source means from the selected one of the plurality of gas supply means;
 iv. upon completion of ion beam deposition of the layer of selected material, closing the valve means connected to the selected one of the plurality of gas supply means for supplying source gas therefrom to the ion beam source means and opening the valve means connecting the selected one of the plurality of gas supply means to the vacuum pump means; and
 v. repeating steps ii.–iv., as desired, to selectively supply source gas from at least one other of the plurality of gas supply means, thereby depositing the multilayer film on the at least one substrate deposition surface.

According to embodiments of the present invention, step (c) comprises utilizing a programmable gas flow controller means operatively connected to each of the valve means for selectively supplying the ion beam source means with source gas from the selected one of the plurality of gas supply means, e.g., a programmable electronic computer electrically connected to each of the valve means.

According to further embodiments of the present invention, step (b) comprises providing a substrate including at least one magnetic or magneto-optic (MO) recording layer on the at least one deposition surface, and step (c) comprises ion beam depositing a multilayer protective overcoat over the at least one magnetic or MO recording layer.

According to still further embodiments of the present invention, step (c) comprises ion beam depositing a plurality of differently constituted, carbon-based protective overcoat layers, e.g., depositing a plurality of hydrogen doped, carbon-based layers each having a different hydrogen content or depositing at least one undoped carbon-based layer and at least one doped carbon-based layer, the dopants including hydrogen and/or nitrogen atoms.

According to yet another aspect of the present invention, an apparatus for multilayer ion beam deposition comprises:
an ion beam source means; and
means for selectively supplying the ion beam source means with source gas from one of a plurality of gas supply means while maintaining a substantially constant flow of source gas from each of the plurality of gas supply means.

Additional advantages of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the description is to be regarded as illustrative in nature, and not as limitative.

BRIEF DESCRIPTION OF THE DRAWINGS

The following detailed description of the embodiments of the present invention can best be understood when read in conjunction with the following drawings, wherein like reference numerals are employed throughout to designate similar features, wherein.

DESCRIPTION OF THE INVENTION

Figure 1:
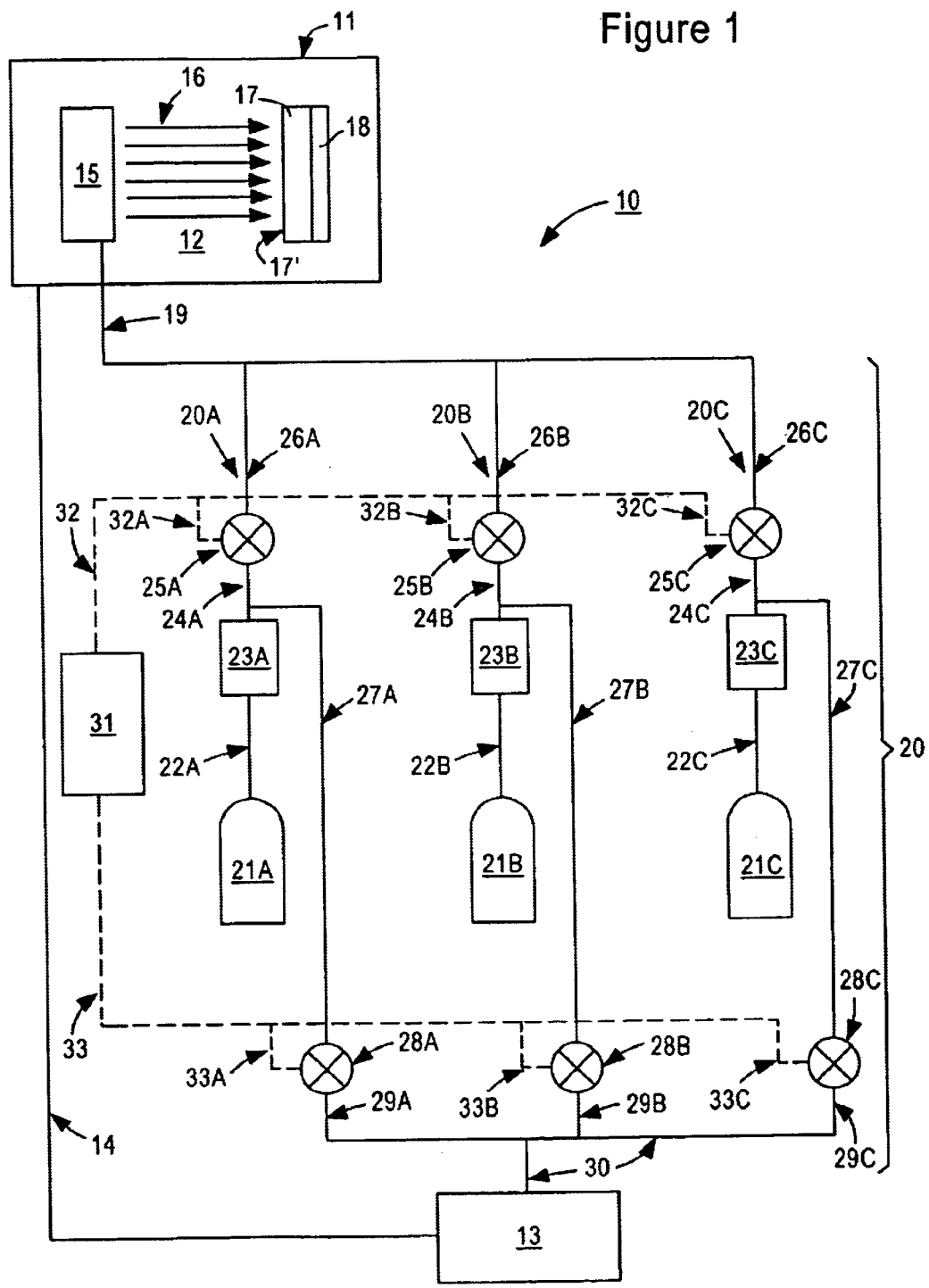
FIG. 1 illustrates, in simplified schematic form, an embodiment of an ion beam deposition system according to the present invention.

The present invention addresses and solves problems attendant upon the use of multi-station apparatus for continuous, automated manufacture of high density magnetic and/or magneto-optical recording media, wherein, as part of the manufacturing methodology, a multilayer protective overcoat, e.g., a carbon-based layer system, is formed over a magnetic or magneto-optical recording layer by means of an ion beam deposition technique. More specifically, the inventive methodology provides for utilization of a single, or common, ion beam source means for deposition of each of the layers constituting the multilayer protective overcoat system, thereby eliminating the need for separate ion beam sources and associated vacuum pump means, whereby advantages of reduced deposition system size and cost are obtained. Even more specifically, the inventive methodology provides continuous, stable ion beam deposition (IBD) of multilayer, carbon-based protective coatings on substrates comprising a magnetic or MO recording layer, wherein the single IBD station utilized for multilayer deposition can readily form part of a multi-process station apparatus for automated manufacturing of a magnetic or MO recording medium involving serial deposition of a plurality of layers on a substrate.

According to the present invention, a single ion beam source is utilized for sequential deposition of several different DLC layers by rapidly switching, i.e., changing, the source gas flows to the ion beam source from a plurality of source gas supply means, without adversely affecting the manufacturing throughput of the deposition system. According to the invention, the plurality of source gas supply means are operated in a "vent/run" mode, wherein a substantially constant gas flow rate from each of the gas supply means to a high capacity pumping means (also utilized for maintaining high vacuum conditions in the process chamber enclosing the ion beam source means) is initially established. A system comprising a plurality of selectively controllable gas flow valve means connected between (1) each of the gas supply means and the ion beam source means and (2) between each of the gas supply means and the high pumping capacity vacuum pump means is operated, as by a programmable electronic computer, for permitting source gas to flow to the ion beam source means from a selected one of the plurality of gas supply means ("run" mode) while source gas from all others of the plurality of gas supply means is constrained to flow to the vacuum pump means at the previously established, substantially constant rate ("vent" mode). Upon completion of ion beam deposition (i.e., when a desired layer thickness is achieved) utilizing the source gas from the selected one of the plurality of gas supply means, the flow of source gas therefrom (i.e., "run" mode) to the ion beam source means is terminated, as by closure of the valve means connecting the selected gas supply means to the selected gas supply means, and the valve means connecting the selected gas supply means to the vacuum pump means is opened, thereby to maintain the flow of source gas from the selected gas supply means at the previously established substantially constant flow rate ("vent" mode). The selective IBD process as just described is then repeated, as desired, by establishing a flow of source gas to the ion beam source means from a different selected one of the plurality of gas supply means ("run" mode), while flowing source gas from all of the others of the plurality of gas supply means to the high capacity vacuum pump means at the previously established, substantially constant flow rate ("vent" mode). According to the inventive methodology and apparatus, contamination of individual layers of the multilayer stack due to the presence of residual gases from previous layer deposition is substantially eliminated, or at least minimized, by use of a high-speed, high-capacity, turbo-molecular vacuum pump which can evacuate the residual gases from the process chamber at a high rate.

Referring now to FIG. 1, shown therein, in simplified schematic view, is an ion beam deposition (IBD) system 10 according to an embodiment of the present invention, which system 10 can be used independently or form part of a multi-station apparatus utilized in automated manufacturing processing, e.g., manufacture of magnetic and/or MO recording media. As illustrated, system 10 comprises a process chamber 11 (which chamber can, if desired, constitute a sub-chamber forming part of a multi-station apparatus or system within a larger chamber) having an interior space 12 adapted to be maintained under high vacuum conditions by means of vacuum pump means 13, e.g., a high capacity, high rate turbo-molecular pump of conventional type, and vacuum line 14. Located within interior space 12 is an ion beam source means 15, typically a wide beam ion-source means, e.g., a circularly-shaped, gridless end-Hall or closed drift end-Hall ion beam source, or a Kaufman type ion bean source, such sources being described in *Handbook of Ion Beam Processing Technology*, J. J. Cuomo et al., editors, Noyes Publications, Park Ridge, N.J., pp. 40–54, and in U.S. Pat. Nos. 4,862,032; 5,192,523; 5,482,602; and 5,508,368, the entire disclosures of which are incorporated herein by reference. Ion beam source means 15 is adapted to emit therefrom a wide ion beam 16 for IBD of a desired coating material on a deposition surface 17' of a substrate 17 mounted on substrate mounting means 18 positioned within the interior space 12 of process chamber 11. Source gas(es) for the IBD are supplied to the ion beam source means 15 via source gas feed conduit 19 passing through the wall of process chamber 11. Source gas(es) feed conduit 19 is, in turn, supplied with source gases from a plurality of substantially identically-structured gas supply means 20, illustratively three, i.e., 20A, 20B, and 20C, but not limited thereto. As illustrated, each gas supply means 20 comprises a respective gas storage means 21A, 21B, 21C for storing at least one source gas or a mixture of source gases, connected via a respective conduit 22A, 22B, 22C to a respective mass flow controller (MFC) 23A, 23B, 23C for providing a substantially constant gas flow from each gas storage means. At the upper, or outlet, end of each mass flow controller 23A, 23B, and 23C, a respective first branch conduit 24A, 24B, 24C is fluidly connected to a respective remotely controllable supply valve means 25A, 25B, 25C, which in turn is fluidly connected to source gas feed conduit by means of a respective conduit 26A, 26B, 26C. A respective second branch conduit 27A, 27B, 27C extending from the upper, or outlet, end of each mass flow controller 23A, 23B, and 23C is fluidly connected via respective remotely controllable vent valve means 28A, 28B, and 28C, respective conduits 29A, 29B, and 29C, and exhaust conduit 30 to vacuum pump means 13. A programmable gas flow controller means 31, typically computer-controlled, communicates (e.g., pneumatically or electrically) with each of the remotely controllable valve means 25A, 25B, and 25C via line 32 and respective branch lines 32A, 32B, and 32C, whereas gas flow controller means 31 similarly communicates with each of the remotely controllable valve means 28A, 28B, and 28C via line 33 and respective branch lines 33A, 33B, and 33C.

When utilized in the manufacture of magnetic and/or MO type recording media for IBD of multilayer carbon-based protective overcoats, each of the source gas storage means 21A, 21B, 21C, etc. contains at least one carbon-containing source gas (e.g., methane, $CH_4$, or acetylene, $C_2H_2$) and as is necessary for the particular multilayer system desired to be ion beam deposited, hydrogen gas ($H_2$) and/or nitrogen gas ($N_2$) as typical dopant sources. In some instances, each of the source gas storage means may contain the same dopant source gas, e.g., $H_2$ or $N_2$, but at different concentrations for forming carbon-based films or layers with different dopant concentrations.

Remotely controllable valve means 25A, 25B, 25C, 28A, 28B, and 28C may be, for example, pneumatically or electrically actuated (e.g., solenoid actuated) and of normally closed type. Vacuum pump means 13 is selected to be of sufficient pumping capacity and rate to provide the desired vacuum level in process chamber 11 and quick withdrawal therefrom of residual source gases between successive layer depositions in order to prevent cross-contamination of the individual layers constituting the multilayer stack.

In a typical operating sequence of IBD system 10, each of the supply valve means 25A, 25B, and 25C is initially maintained in a closed state while each of vent valve means 28A, 28B, and 28C is maintained in an open state and each of the mass flow controllers 23A, 23B, and 23C is adjusted to provide a substantially constant source gas flow from the respective source gas storage means 21A, 21B, 21C. Thus, in this state, each of the source gas supply means 20A, 20B, and 20C is in a "vented" state and IBD does not occur. Then, depending upon which of source gas supply means 20A, 20B, or 20C is selected to supply source gas to the ion beam source means 15, each of the respective supply and vent valve means 25, 28 are activated by means of-gas flow controller 31 and associated control lines 32 and 33 to close the vent valve means 28 and open the supply valve means 25, whereby source gas is supplied to the ion beam source means 15 at the previously established substantially constant rate ("run" state) and IBD of a layer of desired composition occurs on substrate deposition surface 17'. After a desired thickness of the desired composition layer has been formed on the substrate, gas flow controller 31 activates the respective valve means 25, 28 to close the supply valve means 25 and thereby stop flow of the source gas to the ion beam source means and to open the vent valve means 28 ("vent" state) for venting of the source gas to the vacuum pump means 13, while still maintaining the source gas flow from the selected source gas supply means 20 at its previously established substantially constant gas flow rate. After a short interval sufficient to remove residual source gas(es) from the process chamber 12 and thus reduce or substantially eliminate the likelihood of cross-contamination of the next-deposited film, the above-described sequence of valve openings and closing for conversion of a selected source gas supply means from its "vent" state to its "run" state is repeated, as required, to form a desired multilayer stack.

Figure 2:
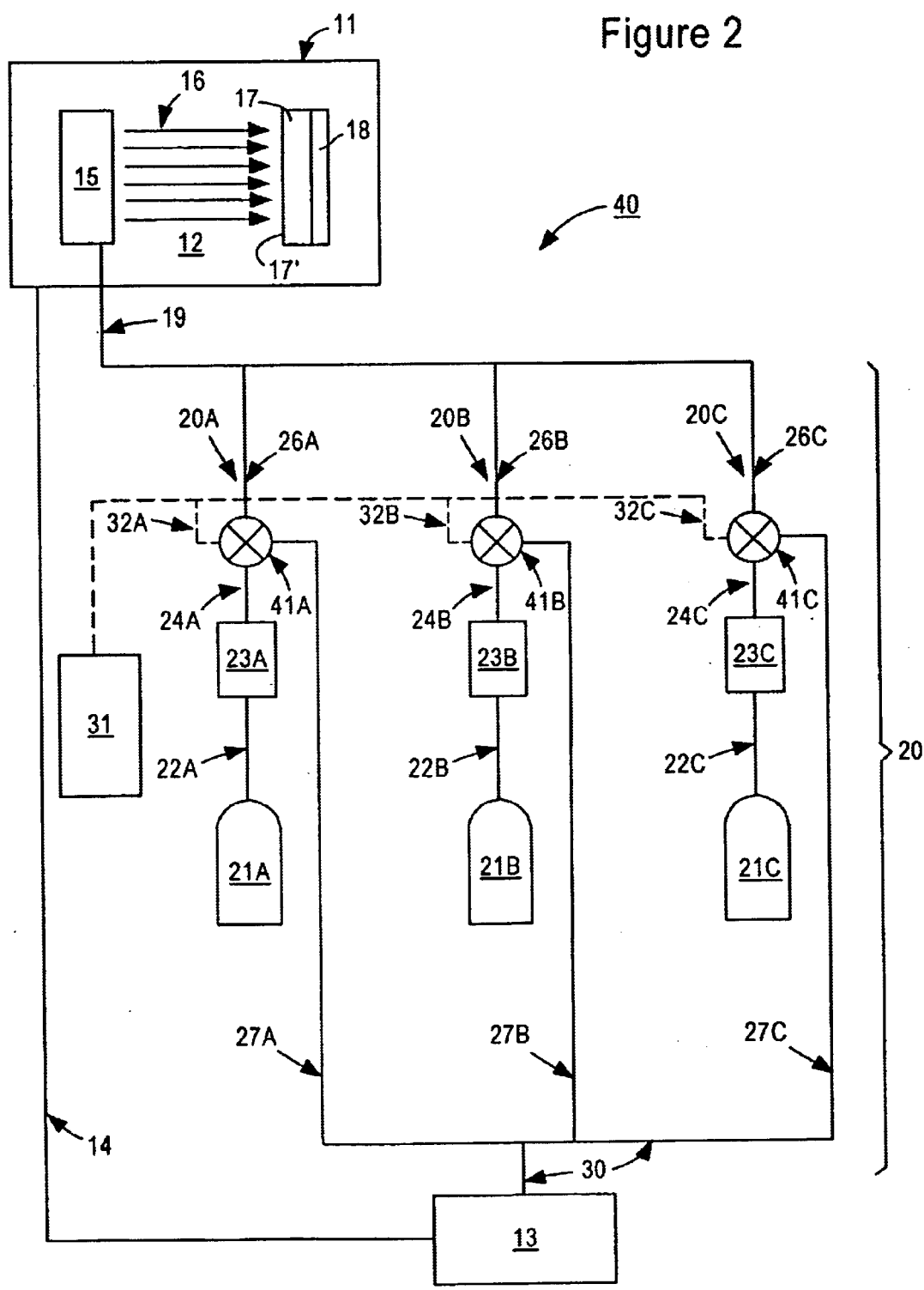
FIG. 2 illustrates, in simplified schematic form, another embodiment of an ion beam deposition system according to the present invention.

Referring now to FIG. 2, wherein like reference numerals are employed to denote similar features, in another embodiment of an IBD system 40 according to the present invention, each of the two separate 2-way valve means 25, 28 required for each source gas supply means 20 of the FIG. 1 embodiment are replaced with a single 3-way valve means 41A, 41B, and 41C for selecting the "run" and "vent" states for each of the source gas supply means. Apart from the simplified valve/control arrangement provided thereby, operation of IBD system 40 is identical in all other respects to that of IBD system 10 of FIG. 1.

The present invention thus provides a number of advantages over conventional methodology for forming multilayer stacks and coatings by IBD, e.g., carbon-based multilayer protective overcoats in the manufacture of magnetic and MO-type recording/information storage and retrieval media. The present invention affords advantages of substantial apparatus simplification vis-à-vis conventional sputtering apparatus as well as cost and size reduction made possible by the use of a single IBD source. Moreover, the present invention can be utilized independently for multilayer deposition or as part of a multi-station apparatus employed for continuous, automated manufacturing of, e.g., recording media, while being fully compatible therewith.

In the previous description, numerous specific details are set forth, such as specific materials, structures, reactants, processes, etc. in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention, and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. An apparatus for multilayer ion beam deposition, comprising:
(a) a process chamber having an interior space adapted to be maintained under vacuum conditions by the action of a single vacuum pump means and including substrate mounting means within said chamber;
(b) an ion beam source means within said process chamber for deposition of at least one film on a surface of a substrate held by said substrate mounting means;
(c) a plurality of gas supply means for supplying said ion beam source means with source gases for film deposition, each of said plurality of gas supply means including means for providing a substantially constant flow of source gas therefrom;
(d) said single vacuum pump means connected to each of said plurality of gas supply means; and
(e) a plurality of valve means, including a valve means connected to each of said plurality of gas supply means and to said vacuum pump means for selectively supplying source gas from one of said plurality of gas supply means to said ion beam source means while venting source gases from all others of said plurality of gas supply means to said single vacuum pump means, for maintaining said substantially constant flow of source gas from each of said plurality of gas supply means, wherein:
each of said plurality of valve means comprises a first valve means connected to a respective one of said plurality of gas supply means for supplying source gas therefrom to said ion beam source means and a second valve means connected to said one of said plurality of gas source means for venting source gas therefrom to said single vacuum pump means, and the second valve means is open when said first valve means is closed and vice versa.

2. The apparatus according to claim 1, wherein:
each of said plurality of gas supply means supplies said ion beam source means with a different source gas for selective ion beam deposition of differently constituted films on said substrate surface.

3. The apparatus according to claim 1, further comprising:
(f) programmable gas flow controller means operatively connected to each said valve means for providing said selective supplying of said ion beam source means with source gas from one of said plurality of gas supply means.

4. The apparatus according to claim 3, wherein:
each said valve means is pneumatically or electrically operated.

5. The apparatus according to claim 1, wherein:
said ion beam source means comprises a broad beam ion source.

6. The apparatus according to claim 5, wherein:
said broad beam ion source comprises an end-Hall type ion beam source or a Kaufman type ion beam source.

7. The apparatus according to claim 1, wherein:
each of said first and second valve means comprise a normally closed valve.

8. An apparatus for multilayer ion beam deposition, comprising:
(a) a process chamber having an interior space adapted to be maintained under vacuum conditions by the action of a single vacuum pump means and including substrate mounting means within said chamber;
(b) an ion beam source means within said process chamber for deposition of at least one film on a surface of a substrate held by said substrate mounting means;
(c) a plurality of gas supply means for supplying said ion beam source means with source gases for film deposition, each of said plurality of gas supply means including means for providing a substantially constant flow of source gas therefrom;

(d) said single vacuum pump means connected to each of said plurality of gas supply means; and (e) a plurality of valve means, including a valve means connected to each of said plurality of gas supply means and to said vacuum pump means for selectively supplying source gas from one of said plurality of gas supply means to said ion beam source means while venting source gases from all others of said plurality of gas supply means to said single vacuum pump means, for maintaining said substantially constant flow of source gas from each of said plurality of gas supply means, wherein:

each of said plurality of valve means is a three-way valve connected to a respective one of said plurality of gas supply means for alternately supplying source gas from said one of said plurality of gas supply means to said ion beam source means and venting source gas from said one of said plurality of gas supply means to said vacuum pump means, and there is only one three-way valve between each of the plurality of gas supply means and said process chamber.

* * * * *